(12) United States Patent
Kromrey

(10) Patent No.: US 9,097,772 B2
(45) Date of Patent: Aug. 4, 2015

(54) BATTERY TEST AND CONDENSATION PREVENTION METHOD, SYSTEM AND APPARATUS

(75) Inventor: Timothy Mark Kromrey, Milwaukee, WI (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 581 days.

(21) Appl. No.: 13/332,447

(22) Filed: Dec. 21, 2011

(65) Prior Publication Data

US 2013/0160522 A1     Jun. 27, 2013

(51) Int. Cl.
*F24F 3/14* (2006.01)
*G01R 31/36* (2006.01)
*H01M 10/42* (2006.01)

(52) U.S. Cl.
CPC .......... *G01R 31/3631* (2013.01); *G01R 31/362* (2013.01); *H01M 10/4285* (2013.01)

(58) Field of Classification Search
CPC ........................................................ F24F 3/14
USPC .............. 236/44 C, 44 A; 320/150, 152, 154; 324/426, 429, 431, 433
See application file for complete search history.

(56) References Cited

U.S. PATENT DOCUMENTS

| 5,346,129 | A  | * | 9/1994  | Shah et al. ................... 236/44 C |
| 5,675,979 | A  | * | 10/1997 | Shah ............................ 62/176.6 |
| 6,043,464 | A  | * | 3/2000  | Berger et al. ................. 219/494 |
| 6,140,928 | A  | * | 10/2000 | Shibuya et al. .......... 340/636.13 |
| 6,161,765 | A  | * | 12/2000 | Kay et al. ..................... 236/49.3 |
| 6,585,168 | B1 | * | 7/2003  | Caprio ......................... 236/44 A |
| 7,327,122 | B2 | * | 2/2008  | Kamenoff ..................... 320/150 |
| 7,541,756 | B1 | * | 6/2009  | Parent et al. ................... 318/139 |
| 7,642,743 | B1 | * | 1/2010  | Nolan et al. ................... 320/107 |
| 2005/0077364 | A1 | * | 4/2005 | Hwang ........................ 236/44 C |
| 2009/0243540 | A1 | * | 10/2009 | Choi et al. ..................... 320/107 |
| 2011/0121789 | A1 | * | 5/2011 | Yang et al. .................... 320/152 |
| 2011/0169650 | A1 | * | 7/2011 | Holloway et al. ............. 340/653 |
| 2011/0288704 | A1 | * | 11/2011 | Schwarz et al. ................ 701/22 |
| 2012/0325429 | A1 | * | 12/2012 | Manahan et al. ............... 165/47 |

OTHER PUBLICATIONS

The International Search Report and Written Opinion, mailed Mar. 19, 2013, for corresponding PCT International Patent Application No. PCT/US2012/064418 (11 pages).

* cited by examiner

*Primary Examiner* — Hezron E Williams
*Assistant Examiner* — Hoang Nguyen
(74) *Attorney, Agent, or Firm* — King & Spalding LLP

(57) ABSTRACT

A single common load is provided for both space heating of the interior of an enclosure and for testing of a back-up battery therewith. The common load is coupled to either the battery for momentary load testing thereof, or to a power supply when heat is to be generated by the load for space heating of an interior of an enclosure. Providing only a single load for both space heating and battery testing results in reduced component costs, space savings and simplification of connections and wiring harnesses required. Power resistors, active components such as transistors or MOSFETs, and/or resistive heat tracing may be used as the common load, and deposed within the interior of the enclosure.

33 Claims, 11 Drawing Sheets

BATTERY TEST AND CONDENSATION PREVENTION METHOD, SYSTEM AND APPARATUS

TECHNICAL FIELD

The present disclosure relates generally to battery testing and prevention of condensation conditions inside of an enclosure, and more particularly, to an apparatus for providing both.

BACKGROUND

Operation of switches, protective devices (e.g., circuit breakers, fuses, electromechanical and solid state relays), contactors, motor overload circuits, and electronic monitoring and control devices (e.g., microcontrollers, data acquisition and control systems) (hereinafter "components") can be affected by changes in the surrounding environment in which these components are disposed. For example, if the components are disposed in an enclosure and the relative humidity of the components' surrounding environment increases and/or interior temperature decreases beyond a certain threshold, thereby causing water condensation thereon, the components may not operate as intended and/or an arc fault condition may occur. Typically, the conditions of the components' surrounding environment are usually apparent when a person opens the enclosure to observe its inside. However, these conditions are not noticed until the enclosure is opened and the components' surrounding environment can be observed. While the components operate to prevent potentially harmful situations, the failure to acknowledge and adjust the components' surrounding environment can lead to other hazardous consequences, such as harm to equipment and/or personnel. Many of these components can be expensive and/or critical to commercial/industrial plant operation and/or personnel safety. If the change in the components' surrounding environment is not properly monitored and controlled, then the expensive and/or critical components can become damaged and/or not operate as intended when the surrounding environment is outside of acceptable operating conditions. Expensive and/or critical equipment that the expensive and/or critical components protect also can become damaged. In addition, replacement of the environmentally damaged expensive and/or critical components can be expensive and time consuming. Generally a heating element is provided in the enclosure that is activated when an interior temperature falls below a temperature set point and/or relative humidity exceeds a relative humidity set point.

Back-up battery operation of the aforementioned electronic monitoring and control devices, and critical interfaces whose states must be maintained during power interruption may also be included in the enclosure. Provision for charging and testing of the back-up battery must also be provided with the control. A battery charger for charging the battery and a resistive load for testing the load capabilities of the battery, e.g., voltage drop under load conditions, are provided in the control enclosure and/or external to the control enclosure.

Providing separate devices for space heating and battery load testing require expensive and space consuming high power resistance elements, wires within a harness to accommodate the heating elements, and control circuits therefore, and a significant amount of space either inside of the enclosure or in another enclosure adjacent thereto.

SUMMARY

Therefore, what is needed is a more cost effective and space efficient solution for providing both space heating of the interior of an enclosure and for testing of a back-up battery therewith. A common resistance load is coupled to either the battery for momentary load testing thereof, or to a power supply when heat is to be generated from the resistance load for space heating of an interior of an enclosure. Providing only a single load for both space heating and battery testing results in reduced component costs, space savings and simplification of connections and wiring harnesses required.

According to a specific example embodiment of this disclosure, an apparatus for testing a battery and space heating an enclosure comprises: at least one switchable resistive or active component(s) that make up a load located in the control; a voltage sensor for measuring voltage of a battery; and monitoring and control equipment coupled to the voltage sensor and controlling the at least one switchable active or passive load; wherein the at least one switchable active or passive load is coupled to a power source when temperature is to be raised in the enclosure; and wherein the monitoring and control equipment couples the at least one switchable active or passive load to the battery when a test thereof is performed.

According to a specific example embodiment of this disclosure, an apparatus for testing a battery and space heating an enclosure comprises: at least one switchable active or passive load located in an enclosure; a relative humidity sensor for measuring relative humidity within the enclosure; a voltage sensor for measuring voltage of a battery; and monitoring and control equipment coupled to and controlling the at least one switchable active or passive load, and coupled to the relative humidity sensor and the voltage sensor; wherein the at least one switchable active or passive load is coupled to a power source when the measured relative humidity is greater than a certain relative humidity value, whereby the enclosure temperature increases to prevent moisture condensation therein; and wherein the monitoring and control equipment couples the at least one switchable active or passive load to the battery when a test thereof is performed.

According to another specific example embodiment of this disclosure, a system for testing a battery and space heating an enclosure comprises: operational electrical components located within an enclosure; at least one active or passive load located within the enclosure; a battery located within the enclosure and coupled to at least one of the operational electrical components; a voltage sensor for measuring voltage of the battery; and monitoring and control equipment coupled to the voltage sensor and controlling the least one switchable active or passive load; wherein the at least one switchable active or passive load is coupled to a power source when temperature is to be raised in the enclosure; and wherein the monitoring and control equipment couples the at least one switchable active or passive load to the battery when a test thereof is performed.

According to another specific example embodiment of this disclosure, a system for testing a battery and space heating an enclosure comprises: operational electrical components located within an enclosure; at least one switchable active or passive load located within the enclosure; a relative humidity sensor for measuring relative humidity located within the enclosure; a battery located within the enclosure and coupled to at least one of the operational electrical components; a voltage sensor for measuring voltage of the battery; and monitoring and control equipment coupled to and controlling the at least one switchable active or passive load, and coupled to the relative humidity sensor and the voltage sensor; wherein the at least one switchable active or passive load is coupled to a power source when the measured relative humidity is greater than a certain relative humidity value, whereby the enclosure temperature increases to prevent moisture condensation therein; and wherein the monitoring and control equipment couples the at least one switchable active or passive load to the battery when a test thereof is performed.

According to yet another specific example embodiment of this disclosure, a method for testing a battery and space heating an enclosure comprises the steps of: testing a battery by coupling at least one switchable active or passive load located within an enclosure to the battery and measuring a voltage drop thereof; measuring a relative humidity within the enclosure; determining whether the measured relative humidity within the enclosure is approaching a specified relative humidity value; connecting the at least one switchable active or passive load to a power source when the measured relative humidity is greater than the specified relative humidity value, thereby increasing temperature and reducing the relative humidity within the enclosure; and returning to the step of measuring the relative humidity within the enclosure.

According to still another specific example embodiment of this disclosure, a method for testing a battery and space heating an enclosure comprises the steps of: testing a battery by coupling at least one switchable active or passive load located within an enclosure to the battery and measuring a voltage drop thereof; measuring a temperature within the enclosure; connecting the at least one switchable load to the power source if the measured temperature is less than a specified low temperature value; and returning to the step of measuring the temperature within the enclosure.

BRIEF DESCRIPTION OF THE DRAWINGS

For a more complete understanding of the present invention and the advantages thereof, reference is now made to the following description, in conjunction with the accompanying figures briefly described as follows.

Figure 1:
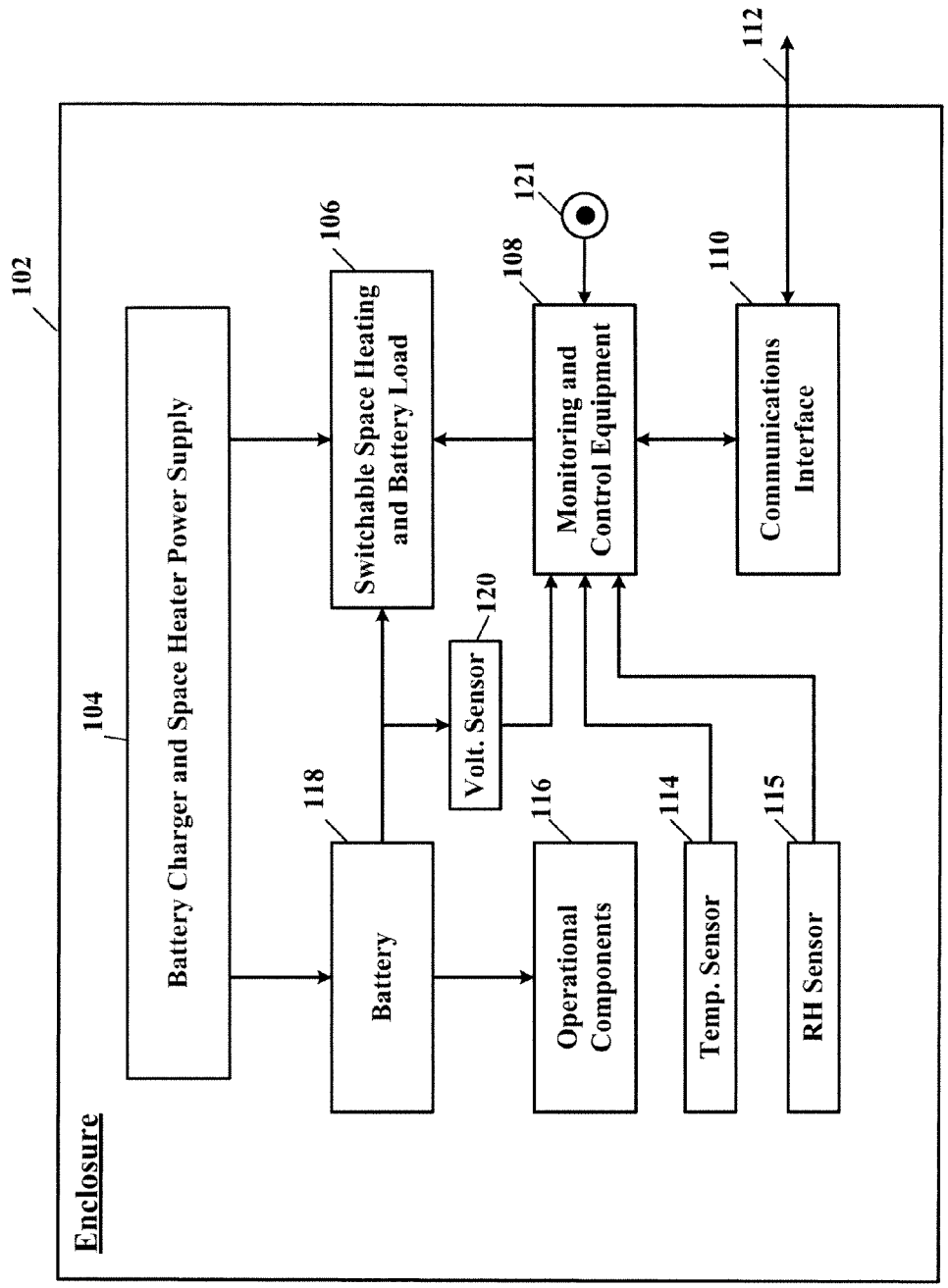
FIG. 1 illustrates a schematic block diagram of an enclosure having operational components, monitoring and control equipment, sensors, battery back-up and a communications interface located therein, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION OF SPECIFIC EXAMPLE EMBODIMENTS

Referring now to the drawings, details of example embodiments of the present invention are schematically illustrated. Like elements in the drawings will be represented by like numbers, and similar elements will be represented by like numbers with a different lower case letter suffix.

Referring to FIG. 1, depicted is a schematic block diagram of an enclosure having operational components, monitoring and control equipment, sensors, battery back-up and a communications interface located therein, according to a specific example embodiment of this disclosure. An enclosure 102 contains a battery charger and space heater power supply 104, a switchable space heating and battery load 106, monitoring and control equipment 108, a temperature sensor 114, a relative humidity (RH) sensor 115, operational components 116, a battery 118, a battery test push button 121 which may be operated manually, or automatically, and, optionally, a communications interface 110 coupled to an information transmission medium 112.

The enclosure 102 may be, for example, but is not limited to, explosion proof and non-explosion proof, indoor or outdoor, rain tight, dust tight, metal or non-metal NEMA enclosures, and equivalent international enclosures such as IEC standard enclosures. The operational components 116 may be, for example, but are not limited to, circuit breakers, fuses, motor starters, generator control equipment, programmable logic controllers (PLC), industrial process controllers, radio communications relays and repeaters. The operational components 116 may be any electrical/electronic components or equipment that could be damaged if condensing water vapor is allowed to occur on its surface or internal parts.

The switchable space heating and battery load 106 may be, for example, but is not limited to, a resistive element, a transistor(s) or MOSFET(s), electric heat tracing, etc., and may be used as an electric space heater and a test load for the battery 118. The switchable space heating and battery load 106 may include switching devices, e.g., electro-mechanical relays and/or power transistors or MOSFETs, etc., for momentarily connecting the load portion thereof to the battery 118 or for longer term connection to the power supply 104 for enclosure space heating purposes. The monitoring and control equipment 108 may be, for example but is not limited to, relay logic (electro-mechanical and/or solid state), a microcontroller, etc. The battery 118 may be any type of rechargeable battery suitable for the operating temperature and load conditions of the environment and equipment, respectively.

The communications interface 110 may be, for example but is not limited to, a data concentrator having inputs and outputs adapted to interface with the monitoring and control equipment 108, and an interface for the wired or wireless information transmission medium 112. The communications interface 110 can be used with a digital processor based monitoring and control system based upon a microcontroller, data acquisition and control interface such as the input and output modules of a PLC in remote communications with a plant supervisory control and data acquisition (SCADA) system (not shown) over the information transmission medium 112, e.g., wired (Ethernet, Internet, telephone/modem, fiber optic cable, etc.) or wireless (VHF, UHF or microwave telemetry; cell phone, spread spectrum, radio mesh, WiFi, Zigbee, wireless Ethernet (802.11), etc.) The communications interface 110 may also be an integral part of the monitoring and control equipment 108.

The temperature sensor 114 measures the interior temperature of the enclosure 102. The relative humidity sensor measures the relative humidity inside of the enclosure 102. While shown in the exemplary embodiment illustrated in FIG. 1, the relative humidity sensor is not required in alternate embodiments of the disclosure. The voltage sensor 120 can measure the voltage of the battery 118 during operation and testing thereof. For example, during normal operation a determination can be made from the measured battery voltage whether to engage the battery charger portion of the power supply 104 for charging of the battery 118, or maintain a trickle charge thereon. During testing, both no load and load voltages can be measured to determine the charge holding capabilities of the battery 118. The voltage sensor 120 may be an analog or digital voltmeter for local observation during testing of the condition of the battery 118, e.g., by pressing the battery test push button 121; and/or it may be an analog-to-digital converter coupled to the monitoring and control equipment 108. Information from the temperature sensor 114 and/or the relative humidity sensor 115 can be used in determining when power should be applied to the switchable space heating and battery load 106 for space heating purposes to prevent water vapor condensation within the enclosure 102.

Testing of the battery 118 may be performed locally by pressing the battery test push button 121, or remotely with a battery test command over the information transmission medium 112 and through the communications interface 110. Remote monitoring of the enclosure environment and battery condition may be done through the monitoring and control equipment 108 coupled to the communications interface 110, wherein the communications interface 110 is in communications (wire or wireless) with a remote supervisory and control system (not shown).

Figure 2:
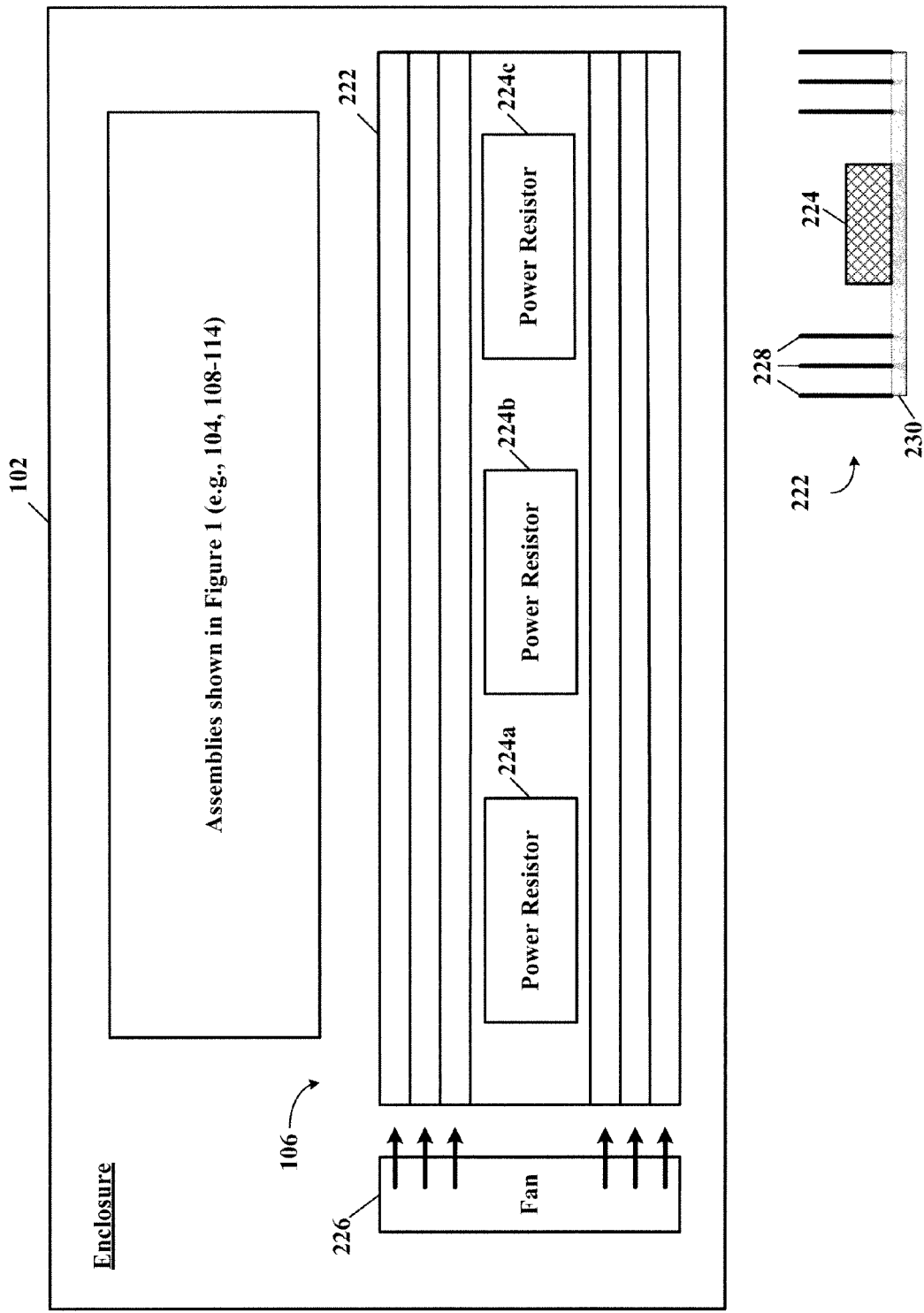
FIG. 2 illustrates a schematic elevational diagram of the enclosure shown in FIG. 1, according a specific example embodiment of this disclosure.

Referring to FIG. 2, depicted is a schematic elevational diagram of the enclosure shown in FIG. 1, according a specific example embodiment of this disclosure. At least one power resistor 224 (three shown) may be mounted on a heat sink 222 and is in thermal communication therewith. The heat sink 222 may comprise a thermally conductive base 230 and may have thermally conductive fins 228 substantially perpendicular thereto. The thermally conductive base 230 and the fins 228 may be made of copper, aluminum, or any other material that has thermally conductive properties. A fan 226 may be used to blow inside air across the heat sink fins 228 and for distributing the air warmed thereby throughout the interior of the enclosure 102.

Figure 3:
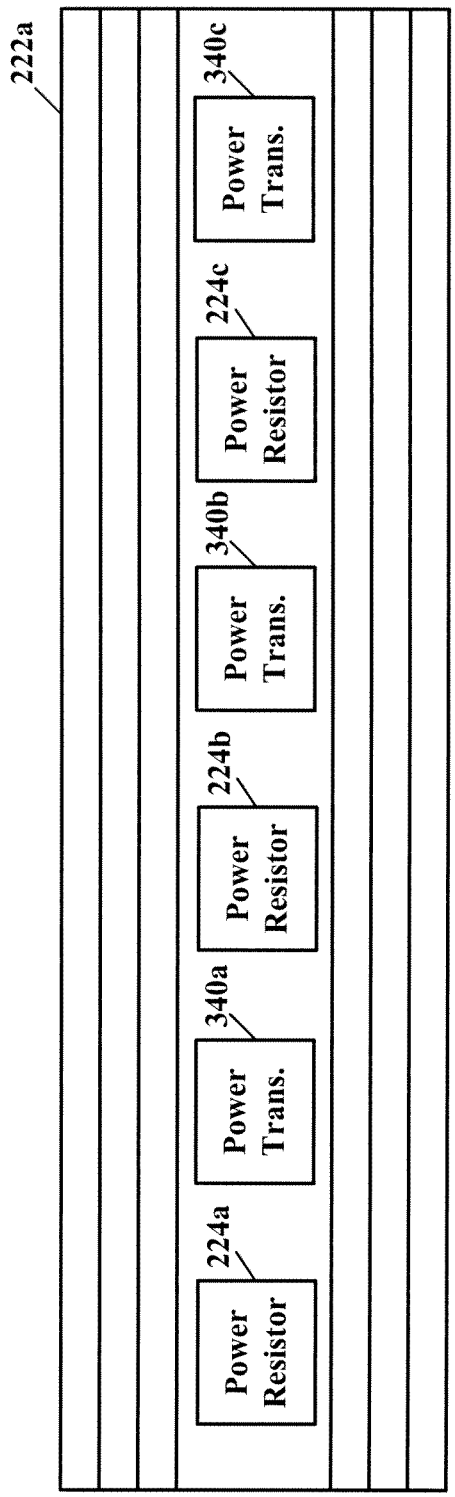
FIG. 3 illustrates a schematic elevational diagram of a heat sink and load resistors attached thereto, according to a specific example embodiment of this disclosure.

Referring to FIG. 3, depicted is a schematic elevational diagram of a heat sink and load resistors attached thereto, according to a specific example embodiment of this disclosure. At least one solid state power transistor or MOSFET 340 may also be attached to and be in thermal communication with the heat sink 222a, so that the heat therefrom may be used in addition to heat from the at least one power resistor 224 for space heating purposes. The at least one power transistor or MOSFET 340 may be used to switch the respective at least one power resistor 224 to the battery 118 for testing purposes thereof, and to the power supply 104 during space heating of the enclosure 102.

Figure 3A:
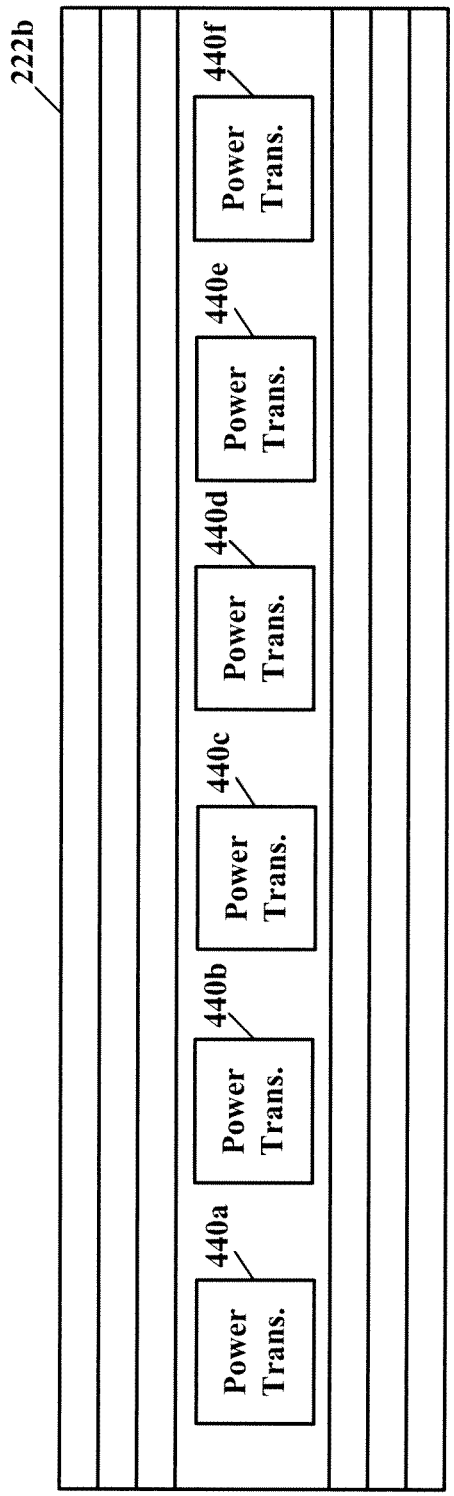
FIG. 3A illustrates a schematic elevational diagram of a heat sink and load power transistors attached thereto, according to another specific example embodiment of this disclosure.

Referring to FIG. 3A, depicted is a schematic elevational diagram of a heat sink and load power transistors attached thereto, according to another specific example embodiment of this disclosure. At least one power transistor or MOSFET 440 may be attached to and be in thermal communication with the heat sink 222b, so that the heat therefrom may be used for space heating purposes. One or more of the power transistors or MOSFETs 440 can be configured to operate at a constant current, and the heating power therefrom is equal to voltage across times the current through the one or more power transistors or MOSFETs 440.

Figure 4:
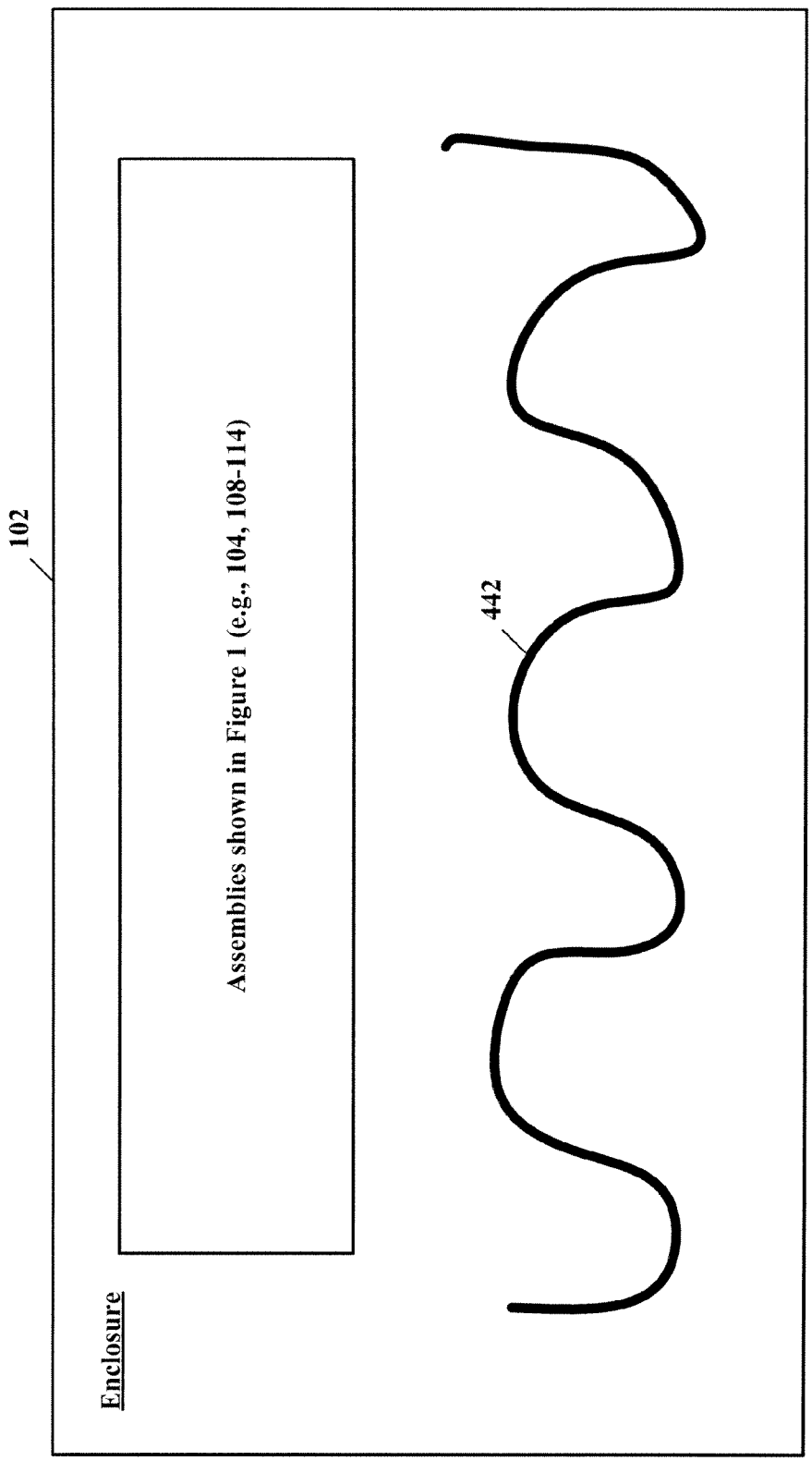
FIG. 4 illustrates a schematic elevational diagram of the enclosure using heat tracing as a load resistor, according to another specific example embodiment of this disclosure.

Referring to FIG. 4, depicted is a schematic elevational diagram of the enclosure using heat tracing as a load resistor, according to another specific example embodiment of this disclosure. Resistive heat tracing 442 may be used with or in place of the at least one power resistor 224. The resistive heat tracing 442 may be deposed on the inside surfaces of the enclosure 102 and/or around some or all of the operational components 116. Electrically, the heat tracing 442 would be coupled to either the battery 118 (during testing thereof) or to the power supply 104 when space heating is required.

Figure 4A:
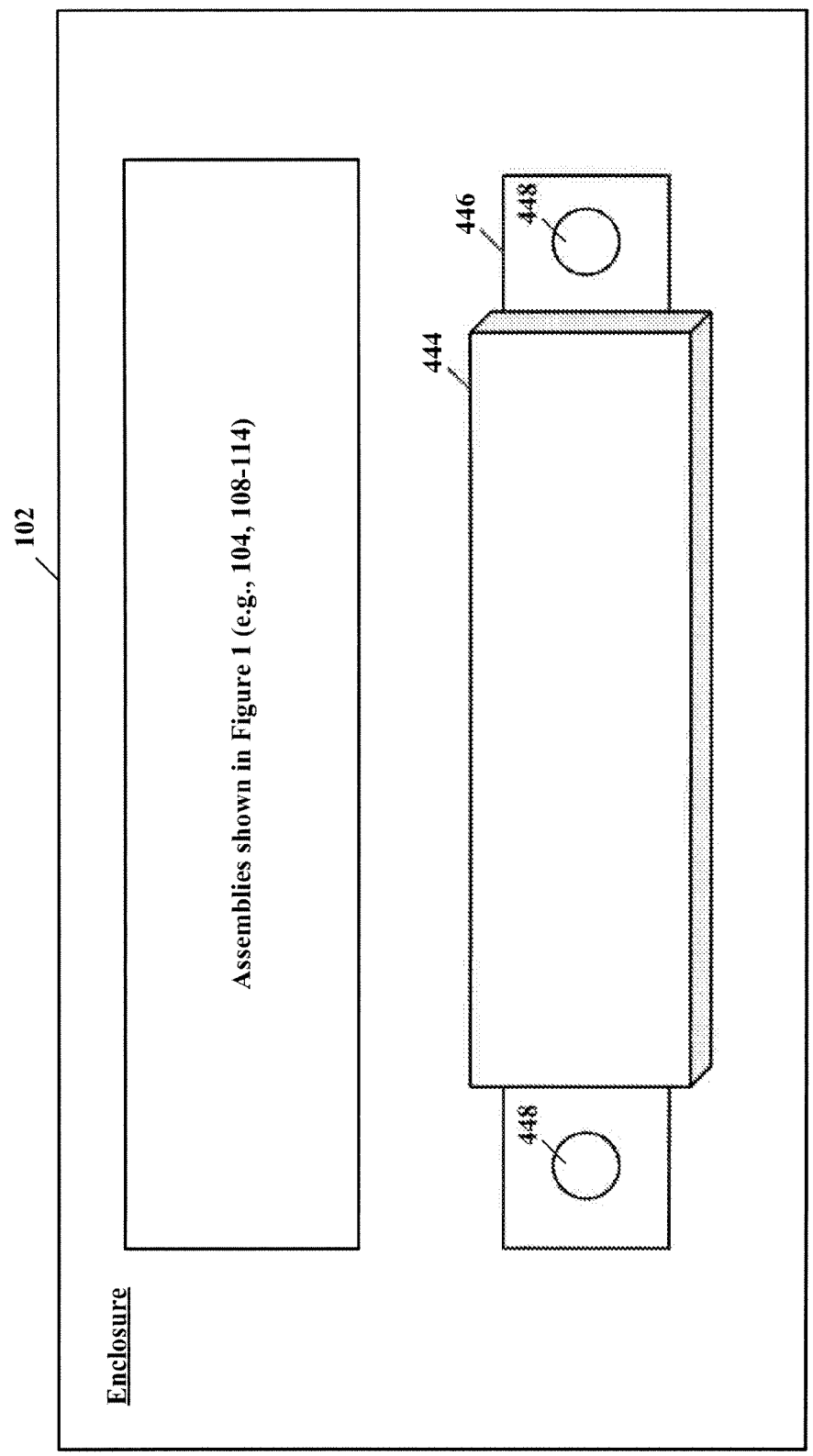
FIG. 4A illustrates a schematic elevational diagram of the enclosure using at least one power load resistor, according to yet another specific example embodiment of this disclosure.

Referring to FIG. 4A, depicted is a schematic elevational diagram of the enclosure using at least one power load resistor, according to yet another specific example embodiment of this disclosure. The at least one power resistor 444 is mounted on a thermally conductive bar 446 that is thermally coupled to the enclosure 102 with, for example but not limited to, bolts 448. Convective heating also will occur with airflow around the at least one power resistor or MOSFET 444. Electrically, the at least one power resistor or MOSFET 444 would be coupled to either the battery 118 (during testing thereof) or to the power supply 104 when space heating is required.

Figure 5:
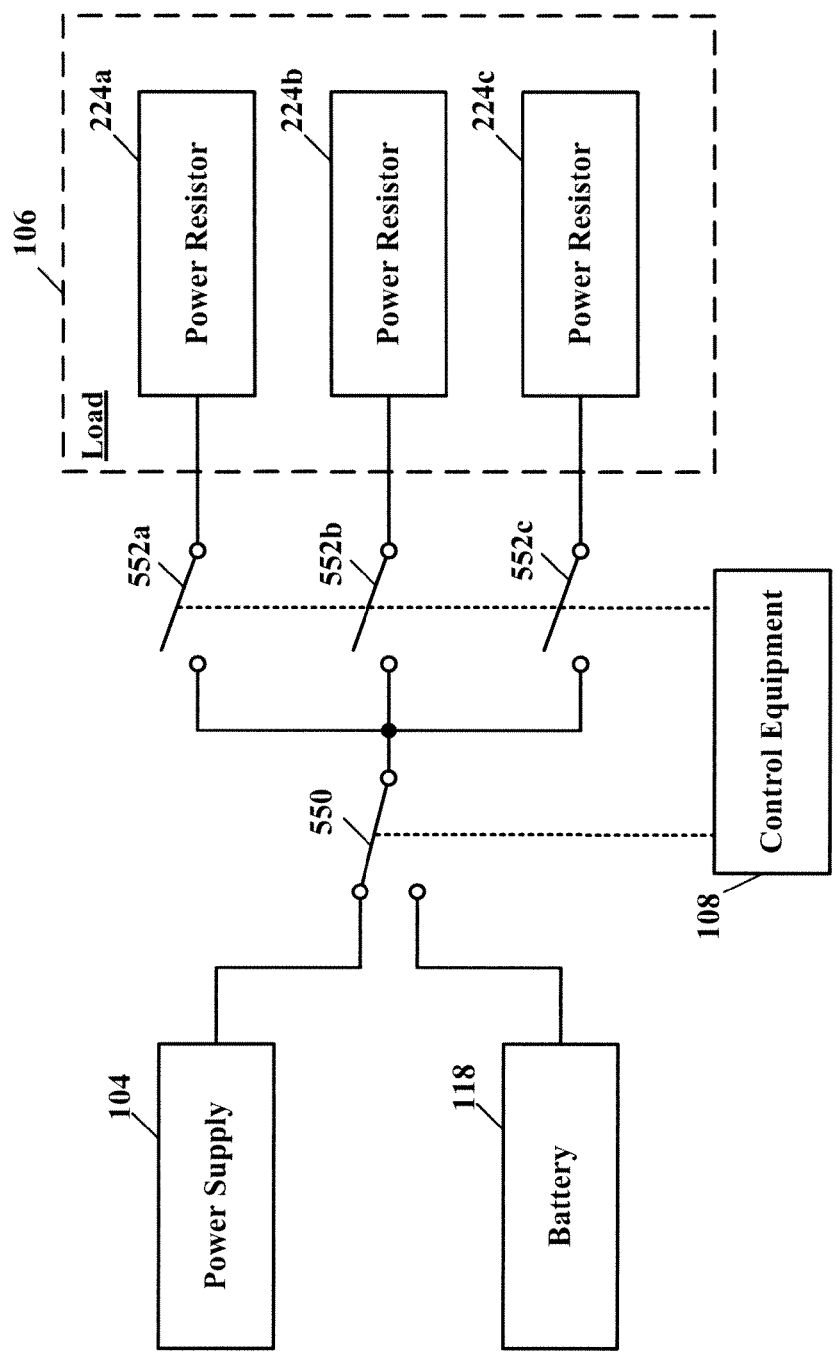
FIG. 5 illustrates a schematic block diagram of the power supply, battery and resistive load shown in FIG. 1, according to the specific example embodiments of this disclosure.

Referring to FIG. 5, depicted is a schematic block diagram of the power supply, battery and resistive load shown in FIG. 1, according to the specific example embodiments of this disclosure. The power supply 104 is connected to and charges the battery 118. The battery 118 may be connected to the monitoring and control equipment 108, and/or the operational components 116. When space heating of the enclosure 102 is required, e.g., based upon the measured interior temperature and/or relative humidity, switch 550 when in a first position and switch 552 when closed will connect the load 106 to the power supply 104. When the battery 118 is being tested, switch 550 when in a second position and switch 552 when closed will connect the load 106 to the battery 118.

Switches 552a-552c, may be used to select any combination of one or more power elements, such as power resistor 224. It is contemplated and within the scope of this disclosure that many other switching combinations may be used with equal effect, and one having ordinary skill in electrical power switching circuits and the benefit of this disclosure would be able to contemplate such alternative switching combinations. For example, switches 550 and 552 may operate in parallel instead of series and be interlocked so both cannot be closed at the same time. The monitoring and control equipment 108 may be used to control the switches 550 and 552. The switches 550 and 552 may be electro-mechanical relays and/or solid state switches, e.g., power transistors. Load 106 as shown with power resistor elements 224a,, 224b,, 224c, may also be comprised of active power transistors and/or MOSFETs that would replace elements 224a,, 224b,, 224c.

Figure 5A:
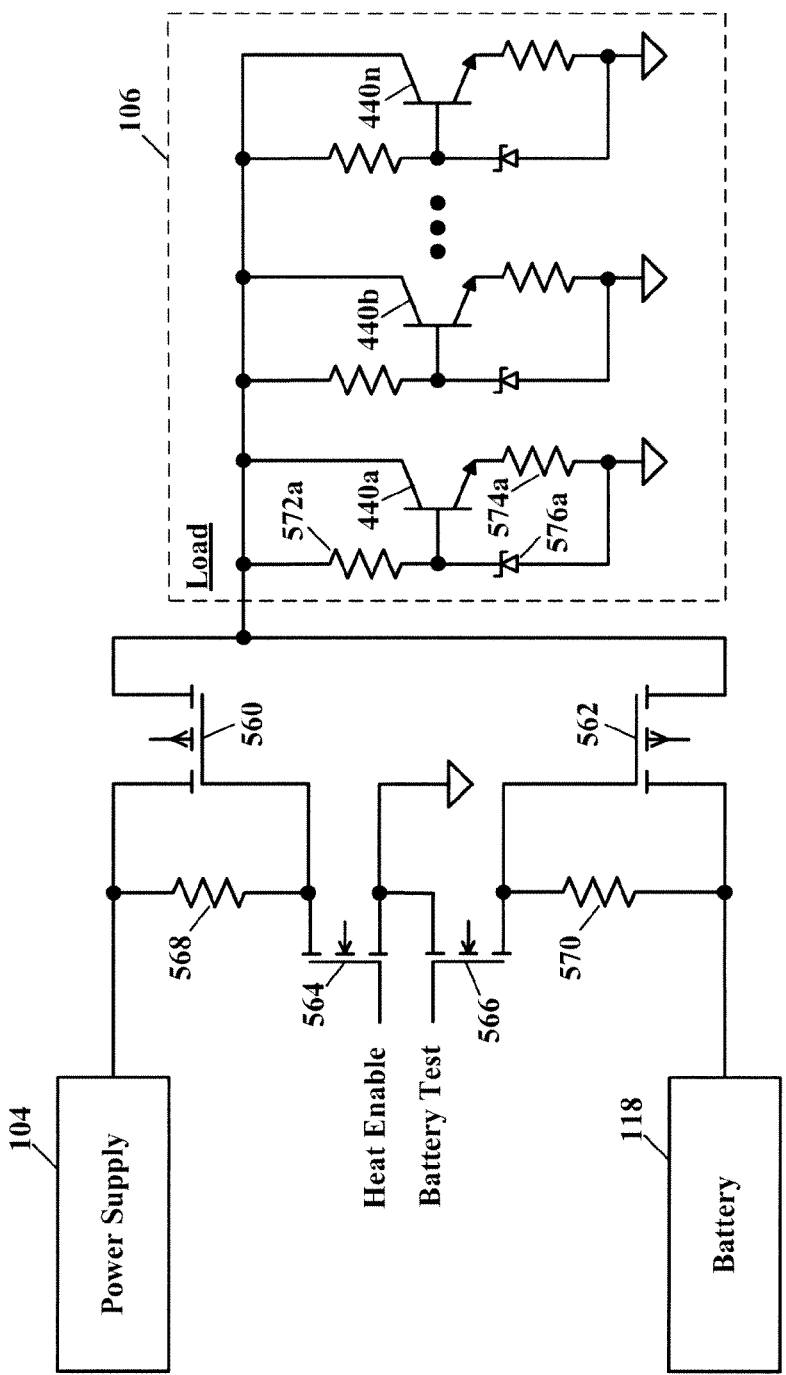
FIG. 5A illustrates a schematic block diagram of the power supply, battery and power transistor load shown in FIG. 3A, according to the specific example embodiments of this disclosure; and also using a single voltage reference 576a, to regulate the load transistors 440a,, 440b,, . . . 440n.

Referring to FIG. 5A, depicted is a schematic block diagram of the power supply, battery and power transistor load shown in FIG. 3A, according to the specific example embodiments of this disclosure. The power supply 104 is connected to and charges the battery 118. The battery 118 may be connected to the monitoring and control equipment 108, and/or the operational components 116. When space heating of the enclosure 102 is required, e.g., based upon the measured interior temperature and/or relative humidity, power switching transistor 560 is turned on into saturation by asserting a logic high on the heat enable control line coupled to the gate of interposing switch transistor 564 which turns it on and causes the power switching transistor 560 to connect the load 106 to the power supply 104. When the battery 118 is being tested, power switching transistor 562 is turned on into saturation by asserting a logic high on the battery test control line coupled to the gate of interposing switch transistor 566 which turns it on and causes the power switching transistor 562 to connect the load 106 to the battery 118.

The power transistor load comprises at least one power transistor 440 configured to draw a constant current based upon the value of the emitter resistor 574 and the voltage of the zener diode 576. When the voltage drop across the resistor 574 is equal to the voltage of the zener 576 minus the Vbe drop, the constant current will be in equilibrium. Diode 576a, may also be a shunt regulator the same as or similar to, but not limited to, a single or multiple LM431, shunt regulator(s).

Figure 6:
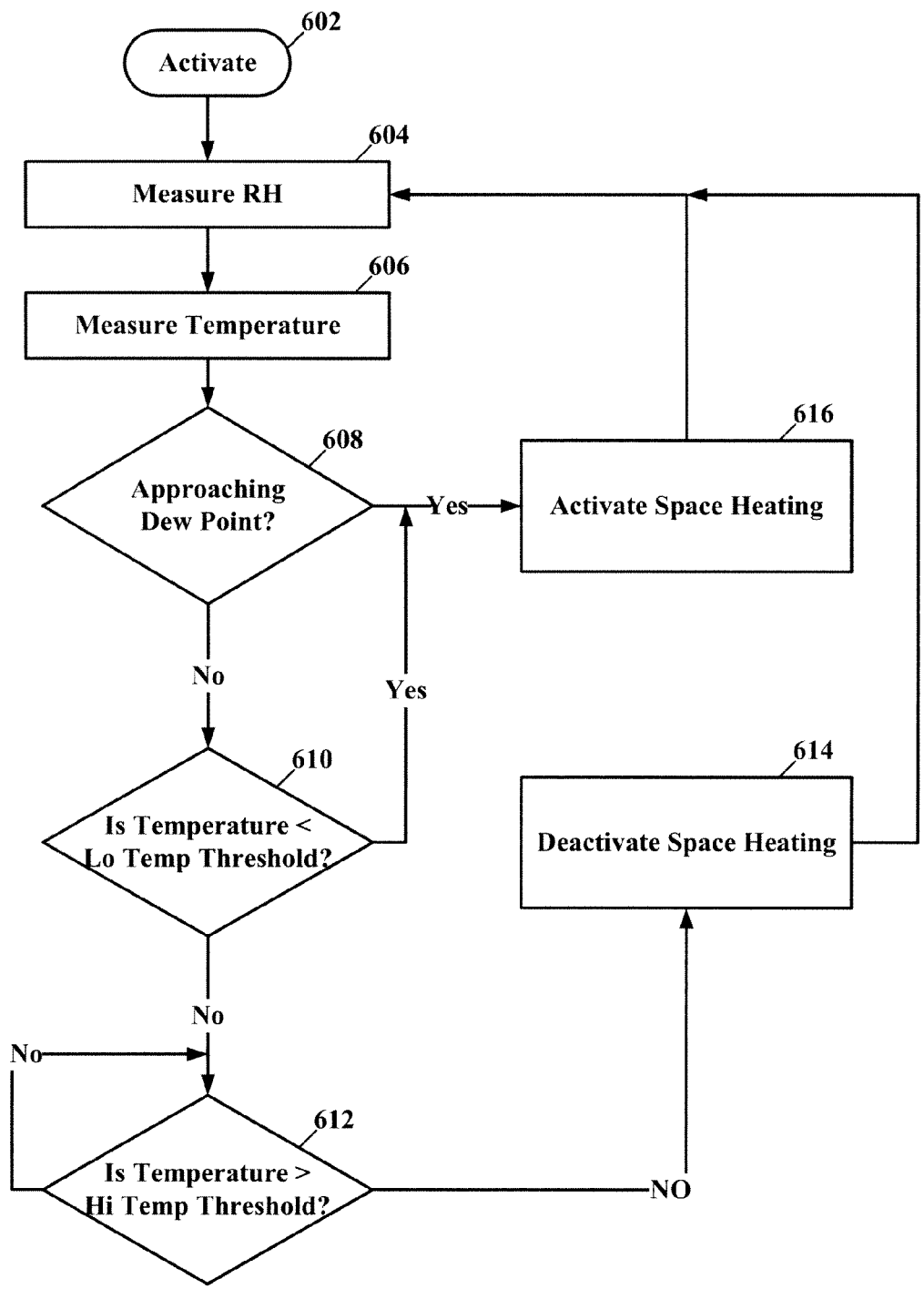
FIG. 6 illustrates a schematic operational process flow diagram for enabling space heating to prevent moisture build up in the enclosure shown in FIG. 1, according to specific exemplary embodiments of this disclosure.

Referring to FIG. 6, depicted is a schematic operational process flow diagram for enabling space heating to prevent moisture build up in the enclosure shown in FIG. 1, according to specific example embodiments of this disclosure. In step 602 the monitoring and control equipment 108 is activated. In step 604 the interior relative humidity (RH) of the enclosure 102 is measured with the RH sensor 115. In step 606 the interior temperature of the enclosure 102 is measured with the temperature sensor 114. In step 608 the monitoring and control equipment 106 determines whether the interior RH is greater than a RH threshold value, and if greater than the RH threshold value then in step 616 the space heating 106 is activated to raise the enclosure 102 temperature and prevent moisture condensation therein.

In step 610 the monitoring and control equipment 106 determines whether the interior temperature of the enclosure 102 is below a low temperature threshold, and optionally, if so, activates the space heating 106 in step 616. Optionally, the rate of change of the RH and interior temperature can be calculated in determining the potential for water vapor condensation and activation of the space heating 106 to prevent the condensation from happening. Step 612 determines whether the interior temperature of the enclosure 102 is above a high temperature threshold and, if so, in step 614 will deactivate the spacing heating 106.

It is contemplated and within the scope of this disclosure that calculation of RH and temperature change rates, and comparisons to stored expected change rates, control of the load 106, monitoring of the sensors 114 and 115 may be performed by a computer system such as a microcontroller based system (not shown) and may be part of the monitoring and control equipment 108 and/or a remote computer system (not shown) coupled to the communications interface 110.

Figure 7:
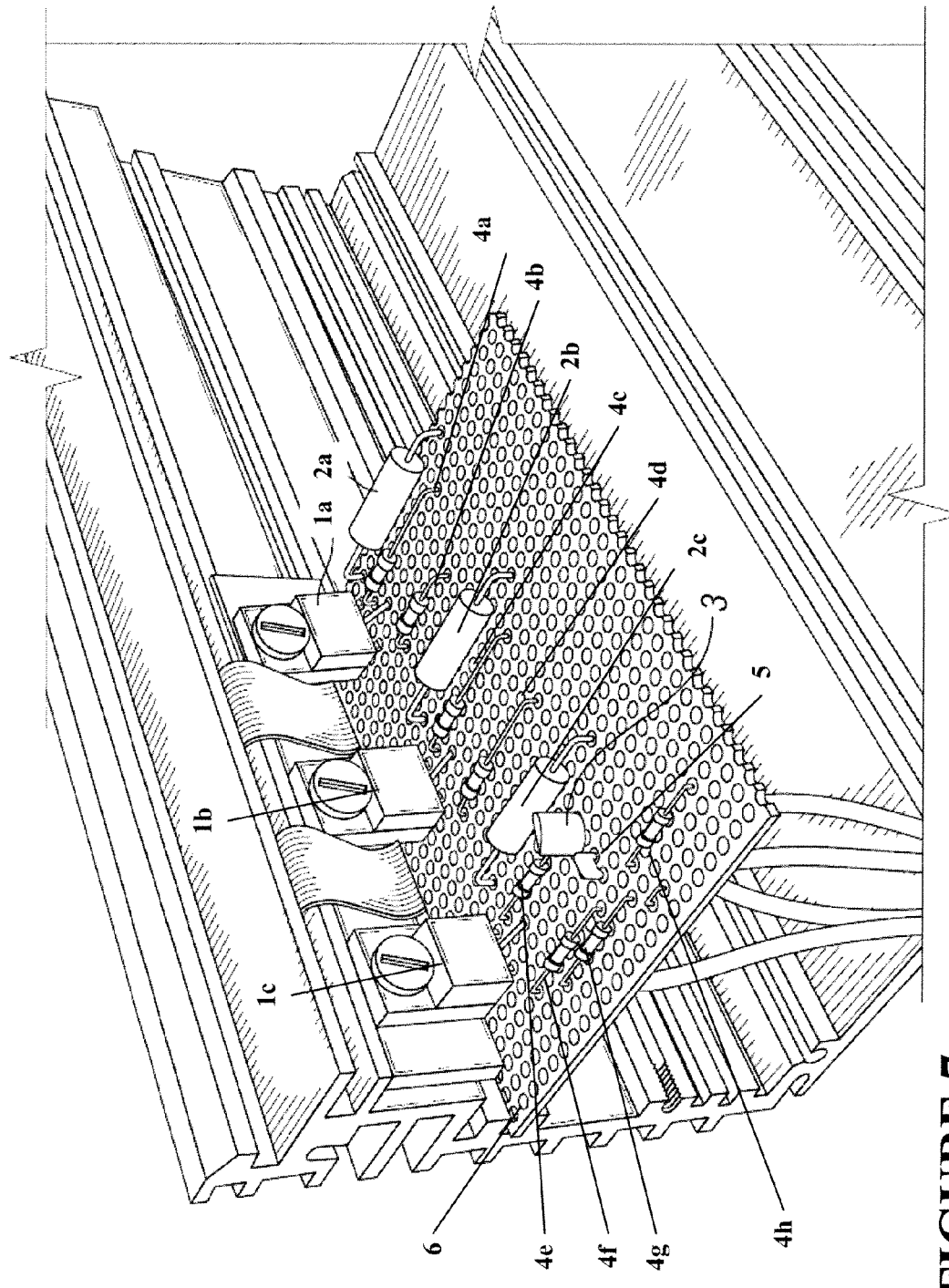
FIG. 7 illustrates a circuit board and circuit components coupled to a heat sink according to an exemplary embodiment of this disclosure.

Referring to FIG. 7, an exemplary embodiment of the present disclosure is shown in the context of a circuit board 6 mounted to a heat sink. Also coupled to the heat sink are power transistors 1a, 1b, and 1c. The power transistors 1a, 1b, and 1c, are coupled to current sense resistors 2a,, 2b,, and 2c. In one exemplary embodiment, each of resistors 2a,, 2b,, 2c, has a resistance of 0.75, ohms. A shunt regulator 3 is shown for regulating the base current of the power transistors 1a, 1b, and 1c. Also shown in FIG. 7 are capacitor 5 and resistors 4a,, 4b,, 4c,, 4d,, 4e,, 4f,, 4g,, and 4h.

Figure 8:
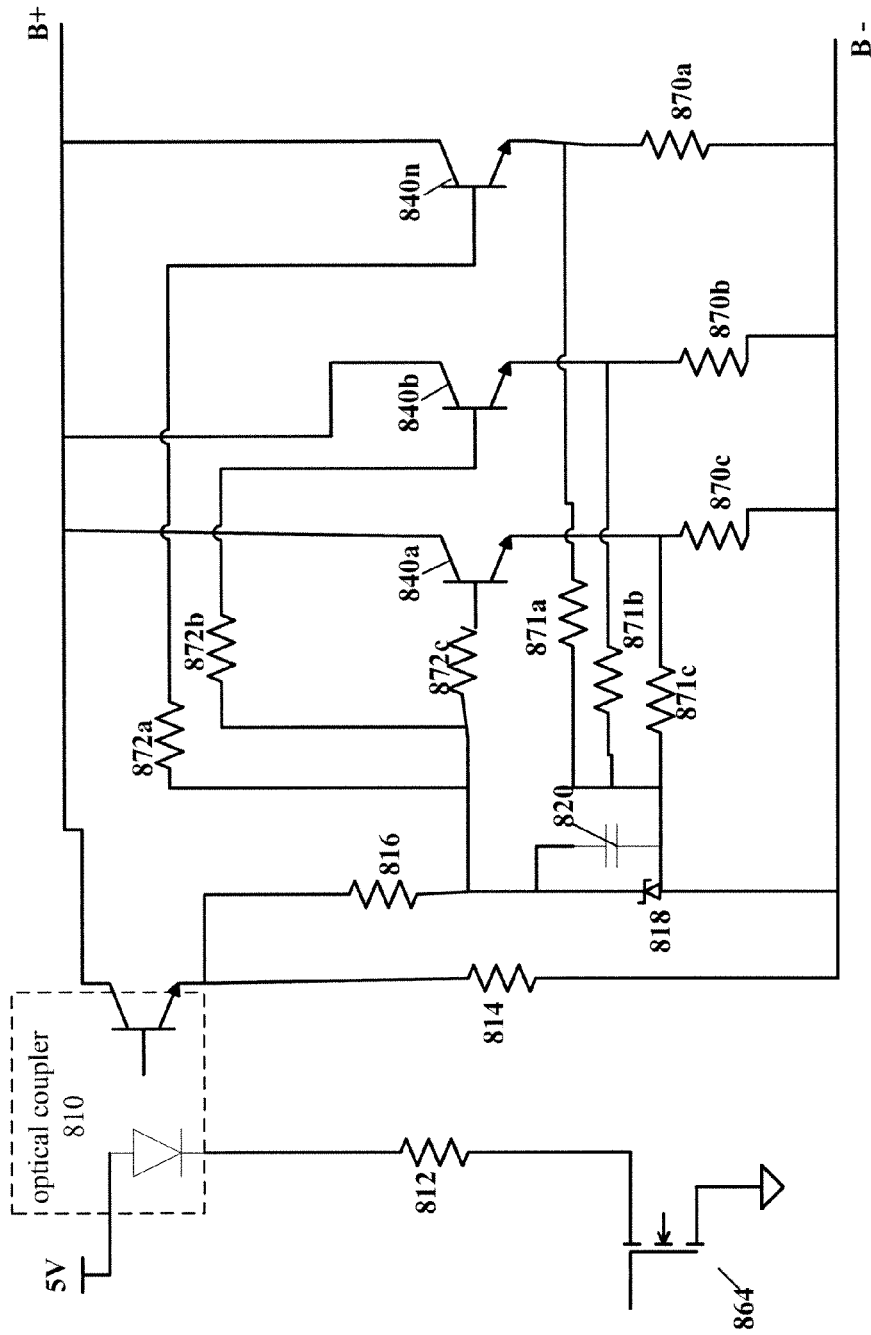
FIG. 8 illustrates a schematic block diagram according to an exemplary embodiment of this disclosure.

Referring to FIG. 8, a schematic block diagram of another exemplary embodiment of the present disclosure is illustrated. FIG. 8 illustrates an optical coupler 810 coupled to a 5V power supply. The power supply can charge a battery (not shown) via switch transistor 864. A load can be applied to either the power supply for heating or to the battery for testing. The load as shown in the exemplary embodiment in FIG. 8 comprises power transistors 840a,, 840b,, and 840n,, shunt regulator 818, capacitor 820, and resistors 814, 816, 870a,, 870b,, 870c,, 871a,, 871b,, 871c,, 872a,, 872b,, and 872c.

Although specific example embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of this disclosure, without departing from the spirit and scope of the invention defined in the following claims, the scope of which is to be accorded the broadest interpretation so as to encompass such modifications and equivalent structures.

I claim:

1. An apparatus for testing a battery and space heating an enclosure, comprising:
   at least one switchable load located in the enclosure, wherein the at least one switchable load is configured to switch between performing a battery test and raising a temperature in the enclosure;
   a voltage sensor for measuring voltage of the battery; and
   monitoring and control equipment coupled to the voltage sensor and configured to switch the at least one switchable load between at least a first position and a second position;
   wherein the at least one switchable load is coupled to a power source and raises the temperature in the enclosure when the at least one switchable load is in the first position; and
   wherein the at least one switchable load is coupled to the battery and performs the battery test when the at least one switchable load is in the second position.

2. The apparatus according to claim 1, further comprising:
   a relative humidity sensor for measuring relative humidity within the enclosure;
   the monitoring and control equipment coupled to the relative humidity sensor;
   wherein the at least one switchable load is switched to the first position and thereby is coupled to the power source when the measured relative humidity is greater than a certain relative humidity value, whereby the enclosure temperature increases to prevent moisture condensation therein.

3. The apparatus according to claim 1, wherein the monitoring and control equipment is located in the enclosure.

4. The apparatus according to claim 1, wherein the battery is located in the enclosure.

5. The apparatus according to claim 1, further comprising a temperature sensor coupled to the monitoring and control equipment, wherein the temperature sensor measures temperature within the enclosure.

6. The apparatus according to claim 5, wherein the monitoring and control equipment couples the at least one switchable load to the power source when the measured temperature is less than a minimum temperature value, whereby the enclosure temperature increases.

7. The apparatus according to claim 5, wherein the monitoring and control equipment couples the at least one switchable load to the power source when the measured temperature indicates a potential moisture condensation condition within the enclosure.

8. The apparatus according to claim 2, wherein the monitoring and control equipment couples the at least one switchable load to the power source when the measured relative humidity indicates a potential moisture condensation condition within the enclosure.

9. The apparatus according to claim 1, further comprising a communications interface coupled to the monitoring and control equipment and adapted for communicating information between the monitoring and control equipment and a remote supervisory and control system.

10. The apparatus according to claim 9, wherein the information between the monitoring and control equipment and the remote supervisory and control system is communicated over a wired medium.

11. The apparatus according to claim 9, wherein the information between the monitoring and control equipment and the remote supervisory and control system is communicated over a wireless medium.

12. The apparatus according to claim 1, wherein the enclosure is selected from the group consisting of, an explosion proof enclosure, a dust proof enclosure, a water proof enclosure, a rain tight enclosure, and an indoor dry use enclosure.

13. The apparatus according to claim 1, wherein the at least one switchable load comprises at least one power resistor, transistor or MOSFET within the enclosure, and at least one switch for coupling the at least one power resistor to either the battery or the power source.

14. The apparatus according to claim 13, wherein the at least one switch is selected from the group consisting of an electro-mechanical relay, a power transistor, and a MOSFET.

15. The apparatus according to claim 1, wherein the at least one switchable load comprises resistive heat tracing within the enclosure, and a switch for coupling the resistive heat tracing to either the battery or the power source.

16. The apparatus according to claim 15, wherein the switch is selected from the group consisting of an electro-mechanical relay, a power transistor, and a MOSFET.

17. The apparatus according to claim 1, wherein the at least one switchable load comprises at least one constant current power transistor or MOSFET.

18. The apparatus according to claim 1, wherein the at least one switchable load is thermally coupled to the enclosure.

19. The apparatus according to claim 1, further comprising a heat sink in thermal communications with the at least one switchable load.

20. The apparatus according to claim 19, further comprising a fan blowing air within the enclosure across the heat sink.

21. A system for testing a battery and space heating an enclosure, said system comprising:
one or more operational electrical components located within the enclosure;
wherein the battery coupled to at least one of the one or more operational electrical components and is charged from a power source;
at least one switchable load located within the enclosure, wherein the at least one switchable load receives power from the battery during a battery test mode, and wherein the at least one switchable load receives power from the power source during a heating mode, wherein temperature is raised in the enclosure during the heating mode;
a voltage sensor for measuring voltage of the battery; and
monitoring and control equipment coupled to the voltage sensor and configured to switch the at least one switchable load between at least the battery test mode and the heating mode.

22. The system according to claim 21, further comprising:
a relative humidity sensor for measuring relative humidity within the enclosure;
the monitoring and control equipment coupled to the relative humidity sensor;
wherein the at least one switchable load is switched to the heating mode and thereby electronically coupled to the power source when the measured relative humidity is greater than a certain relative humidity value, whereby the enclosure temperature increases to prevent moisture condensation therein.

23. The system according to claim 21, further comprising a temperature sensor coupled to the monitoring and control equipment, wherein the temperature sensor measures temperature within the enclosure.

24. The system according to claim 23, wherein the monitoring and control equipment couples the at least one switchable load to the power source when the measured temperature is less than a minimum temperature value, whereby the enclosure temperature increases.

25. The system according to claim 21, wherein the operational electrical components are selected from any one or more of the group consisting of at least one circuit breaker, at least one fuse, at least one motor starter, generator control equipment, programmable logic controller (PLC), industrial process controller, radio communications relay and repeater.

26. A method for testing a battery and space heating an enclosure, said method comprising the steps of:
testing the battery by switching at least one switchable load located within the enclosure to a first position and thereby coupling the at least one switchable load to the battery and measuring a voltage drop thereof;
measuring a relative humidity within the enclosure;
determining whether the measured relative humidity within the enclosure is approaching a certain relative humidity value;
switching the at least one switchable load from the first position to a second position and thereby connecting the at least one switchable load to a power source when the measured relative humidity is greater than the certain relative humidity value, thereby increasing temperature and reducing the relative humidity within the enclosure; and
returning to the step of measuring the relative humidity within the enclosure.

27. The method according to claim 26, further comprising the steps of:
measuring a temperature within the enclosure;
switching the at least one switchable load from the second position to the first position and thereby disconnecting the at least one switchable load from the power source if the measured temperature is greater than a specified high temperature value; and
returning to the step of measuring the temperature within the enclosure.

28. The method according to claim 26, further comprising the steps of:
measuring a temperature within the enclosure;

switching the at least one switchable load from the first position to the second position and thereby connecting the at least one switchable load to the power source if the measured temperature is less than a specified low temperature value; and returning to the step of measuring the temperature within the enclosure.

29. The method according to claim 26, wherein the at least one switchable load comprises at least one power resistor or MOSFET within the enclosure, and at least one switch for coupling the at least one power resistor or MOSFET to either the battery or the power source.

30. The system according to claim 26, wherein the at least one switchable resistive load comprises resistive heat tracing within the enclosure, and switches for coupling the resistive heat tracing to either the battery or the power source.

31. The system according to claim 26, wherein the at least one switchable load comprises at least one constant current power transistor or MOSFET within the enclosure, and switches for coupling the at least one constant current power transistor or MOSFET to either the battery or the power source.

32. A method for testing a battery and space heating an enclosure, said method comprising the steps of:

testing the battery by switching at least one switchable load located within the enclosure to a first state and thereby coupling the at least one switchable load to the battery and measuring a voltage drop thereof;

measuring a temperature within the enclosure;

switching the at least one switchable load from the first state to a second state and thereby connecting the at least one switchable load to the power source if the measured temperature is less than a specified low temperature value; and returning to the step of measuring the temperature within the enclosure.

33. The method according to claim 32, further comprising the steps of:

switching the at least one switchable load from the second state to the first state and thereby disconnecting the at least one switchable load from the power source if the measured temperature is greater than a specified high temperature value; and returning to the step of measuring the temperature within the enclosure.

\* \* \* \* \*